(12) United States Patent
Lin et al.

(10) Patent No.: US 7,878,836 B2
(45) Date of Patent: Feb. 1, 2011

(54) CPU SOCKET WITH LOCKING DEVICE

(75) Inventors: Nan-Hung Lin, Tu-Cheng (TW);
Cheng-Chi Yeh, Tu-Cheng (TW);
Jia-Hau Liu, Tu-Cheng (TW)

(73) Assignee: Hon Hai Precision Ind. Co., Ltd, Taipei Hsien (TW)

( * ) Notice: Subject to any disclaimer, the term of this patent is extended or adjusted under 35 U.S.C. 154(b) by 0 days.

(21) Appl. No.: 12/548,379

(22) Filed: Aug. 26, 2009

(65) Prior Publication Data
US 2010/0055958 A1  Mar. 4, 2010

(30) Foreign Application Priority Data
Aug. 26, 2008  (TW) .............................. 97132445 A

(51) Int. Cl.
*H01R 13/62* (2006.01)
(52) U.S. Cl. ..................................................... 439/331
(58) Field of Classification Search ................. 439/331, 439/68, 71, 72, 73, 74, 660, 330
See application file for complete search history.

(56) References Cited
U.S. PATENT DOCUMENTS

| 7,708,580 | B2 * | 5/2010 | Yeh ............................ 439/331 |
|---|---|---|---|
| 7,708,585 | B2 * | 5/2010 | Yeh et al. ..................... 439/489 |
| 7,736,168 | B2 * | 6/2010 | Yeh et al. ..................... 439/331 |
| 7,744,397 | B2 * | 6/2010 | Yeh et al. ..................... 439/331 |
| 7,753,706 | B2 * | 7/2010 | Liu et al. ..................... 439/331 |
| 2009/0047809 | A1 * | 2/2009 | Yeh .............................. 439/68 |
| 2009/0191744 | A1 * | 7/2009 | Yeh et al. ..................... 439/331 |
| 2009/0264005 | A1 * | 10/2009 | Yeh et al. ..................... 439/331 |
| 2009/0325403 | A1 * | 12/2009 | Yeh .............................. 439/73 |
| 2010/0055958 | A1 * | 3/2010 | Lin et al. ..................... 439/331 |
| 2010/0087085 | A1 * | 4/2010 | Liu et al. ..................... 439/353 |

* cited by examiner

Primary Examiner—Neil Abrams
Assistant Examiner—Phuong Nguyen
(74) Attorney, Agent, or Firm—Andrew C. Cheng; Wei Te Chung; Ming Chieh Chang

(57) ABSTRACT

A CPU socket (1) mounted on a PCB (2) includes a metallic cover (10) and an insulative housing (20). The insulative housing has an installation section (30). The metallic cover has a main portion (11), a locking portion (13) and a resilient portion (12). The resilient portion is rotatably assembly to the installation section. The metallic cover is able to rotate around the resilient portion. The locking portion and the resilient portion extend from opposite sides of the main portion, respectively. The locking portion is able to be locked and released to a locking member (32) which is fixed to the PCB. The locking portion is driven by a screwdriver (5) to release or lock to the locking member (32). The CPU socket provides a solution for locking or releasing from the PCB without a lever, which is used to lock or release the metallic cover.

18 Claims, 4 Drawing Sheets

CPU SOCKET WITH LOCKING DEVICE

BACKGROUND OF THE INVENTION

1. Field of the Invention

The present invention relates to a CPU socket, and in particular to a central processing unit (CPU) socket having a locking device.

2. Description of Prior Arts

Normally, the CPU would be disposed in a CPU socket, and the CPU socket electrically connects to a print circuit board (PCB). Traditionally, the CPU socket has a metallic, rotatable cover and a metallic, rotatable lever. When the cover is at an open position, the CPU can be disposed into connector. Then the cover rotates to a closed position to exert a pressure on the CPU to make sure that the CPU stays in the socket securely. The cover can be rotated from the open position to the closed position. When the cover is in the closed position, the lever locks the cover to prevent the cover undesirably rotating to the open position. The cover and the lever are made of metal, so the weight of the CPU socket is high. The lever could make some troubles, for example, when the lever is operated. It is easily subject to interference with other elements like cables.

Therefore, it is desirable to provide a new CPU socket that eliminates the aforesaid problems.

SUMMARY OF THE INVENTION

Accordingly, an object of the present invention is to provide an CPU socket which have a lock device instead of the lever.

In order to achieve afore-mentioned object, a CPU socket mounted on a PCB includes an insulative housing defining a receiving portion for receiving a CPU, a plurality of terminals disposed in the receiving portion; an installation section arranged with the insulative housing side by side; a metallic cover attached to the insulative housing, and a locking member fixed to the PCB. The metallic cover includes a main portion, a locking portion and a resilient portion. The locking portion and the resilient portion extend oppositely from the main portion, the resilient portion rotatably assembled to the installation section. The locking portion having a pair of hook portions and a tool-receiving cutout defined therebetween. The locking member has a planar locking piece extending parallel to the PCB. And the locking member is arranged at one side of the insulative housing opposite to the installation section; wherein when the metallic cover is at a closed position, where the terminals electrically connect the PCB and the CPU. The pair of hook portions abut against the locking piece to thereby lock the metallic cover on the locking member.

Other objects, advantages and novel features of the invention will become more apparent from the following detailed description of the present embodiment when taken in conjunction with the accompanying drawings.

DETAILED DESCRIPTION OF THE PREFERRED EMBODIMENT

Figure 1:
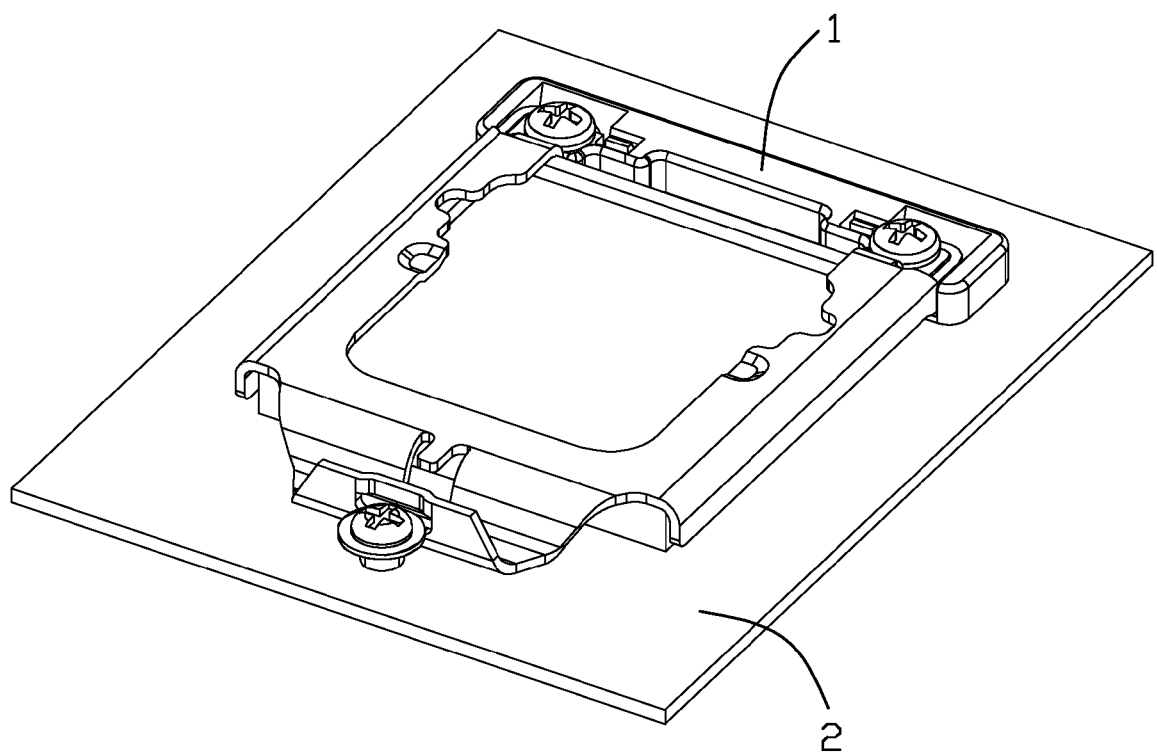
FIG. 1 is a perspective view of a CPU socket in accordance to the present invention.
Figure 2:
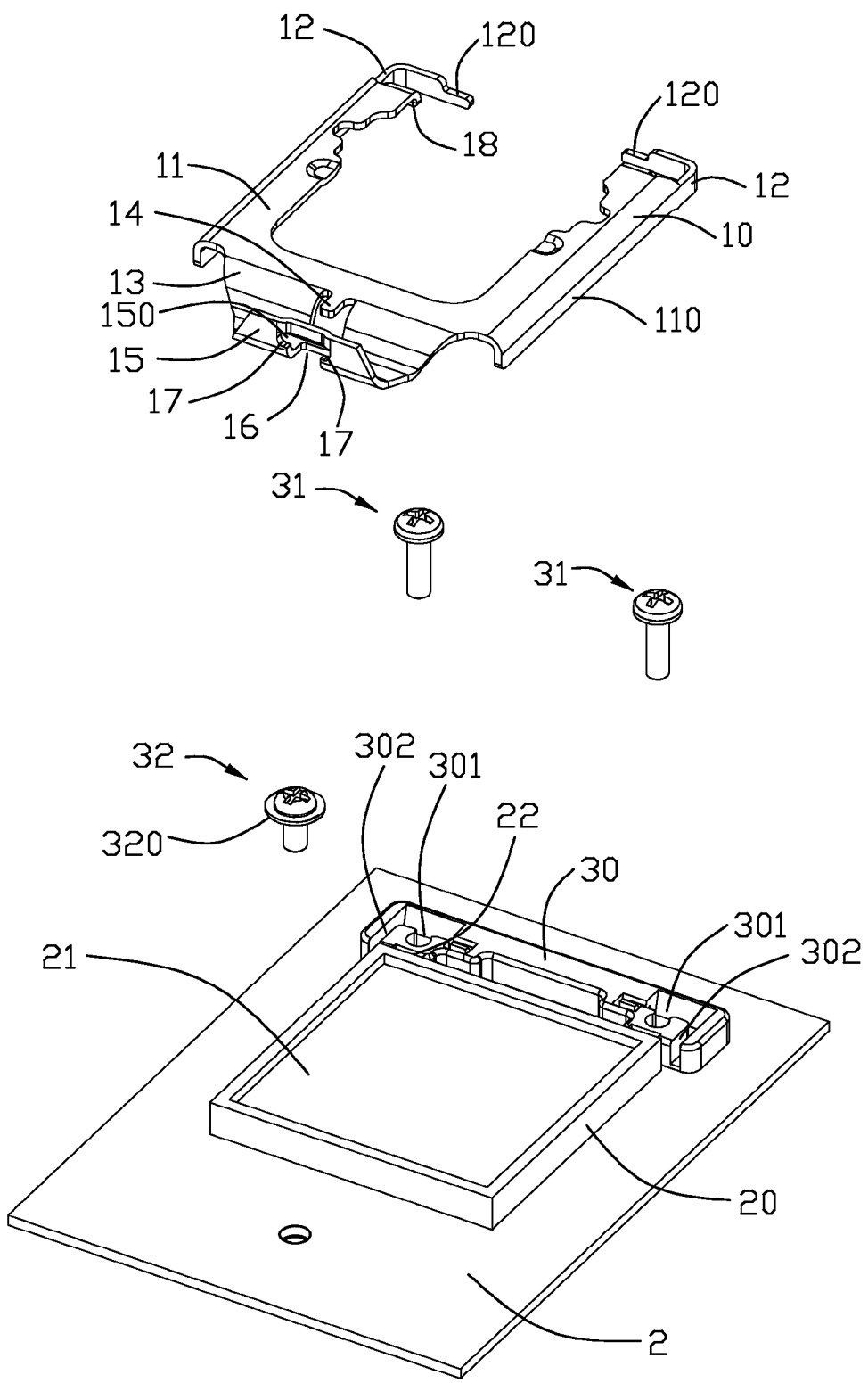
FIG. 2 is an exploded view of FIG. 1.

Referring to FIGS. 1 to 2, the present invention relates to a CPU socket which is assembled to a print circuit board (PCB) 2. The CPU socket includes a metallic cover 10 and an insulative housing 20 with an installation section 30.

Referring to FIG. 2, the metallic cover 10 has a main portion 11 and a pair of lateral side walls 110 extending from opposite sides of the main portion 11, respectively. The main portion 11 and the lateral side wall 110 together define a receiving space (not labeled). A locking portion 13 extends from the main portion 11 at a front side (not labeled), and a resilient portion 12 extends from the lateral side walls 110 at the rear tip end (not labeled). The resilient portion 12 has a pair of rotation posts 120, which forms a right angle with the lateral side walls 110. Tip ends (not labeled) of the rotation posts 120 face to each other. The rotation posts 120 are flexible relative to the main portion 11. The lateral side walls 110 extend along a longitudinal direction. The locking portion 13 has a bottom portion (not labeled) and a locking wall 15. A hook portion 17 is defined at a middle portion of the locking wall 15. The locking wall 15 defines a groove 150 above the hook portion 17. A cutout 16 is formed on the bottom portion and the locking wall 15. The cutout 16 divides the hook portion 17 into two pieces. The main portion 11 defines a protruding tab 14 extending towards the locking wall 15 from a front side thereof. The protruding tab 14 faces to the cutout 16. The main 11 portion further includes a pair of fixing pins 18 extending in a vertical direction.

The insulative housing 20 is disposed on the PCB 2, which is rectangular. The insulative housing 20 has a receiving portion 21 for receiving a CPU. A plurality of terminals are received in the receiving portion 21. The terminals electrically connect the CPU and the PCB. The installation section 30 is assembled to the PCB 2, and is attached to the rear end of the insulative housing 20. In the preferred embodiment the installation section 30 is separately formed. While in other embodiment, the installation section 30 can be integrally formed with the housing. The width of the installation section 30 is larger than the width of the receiving portion 21. Each opposite side of the installation section 30 defines a cavity 301, a slot 302 and a screw hole (not labeled), respectively. The slot 302 communicates with the cavity 301, and extends along a direction parallel to the lateral side walls 100. A pair of screws 31 are assembled into the screw holes, respectively. The pair of screws 31 make the insulative housing 20 and installation section 30 fix on the PCB 2.

A locking member 32 is fixed to the PCB. The locking member 32 is a bolt with a washer 320. The washer 320 is integrally formed with the locking member 32.

The pair of resilient portions 12 of the metallic cover 10 are received in the pair of cavities 301 of the installation section 30, respectively. The rotation posts 120 can rotate in the cavities 301 as the metallic cover 10 is driven from a closed position to an open position or from an open position to a closed position. When the metallic cover 10 is in the closed position, the hook portion 17 engages the washer 320, and the washer 320 partially inserts into the groove 150. The lateral side walls 110 are received in the slots 302. The pair of fixing pins 18 insert into a pair of grooves 22 of the insulative housing 20.

Figure 3:
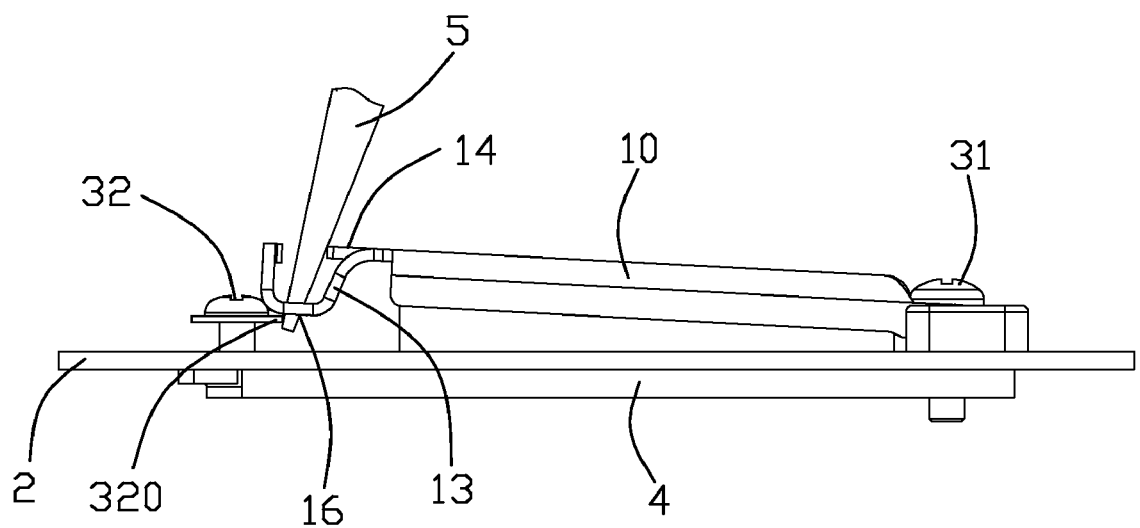
FIG. 3 shows the screwdriver driving a metallic cover to lock with a locking member.
Figure 4:
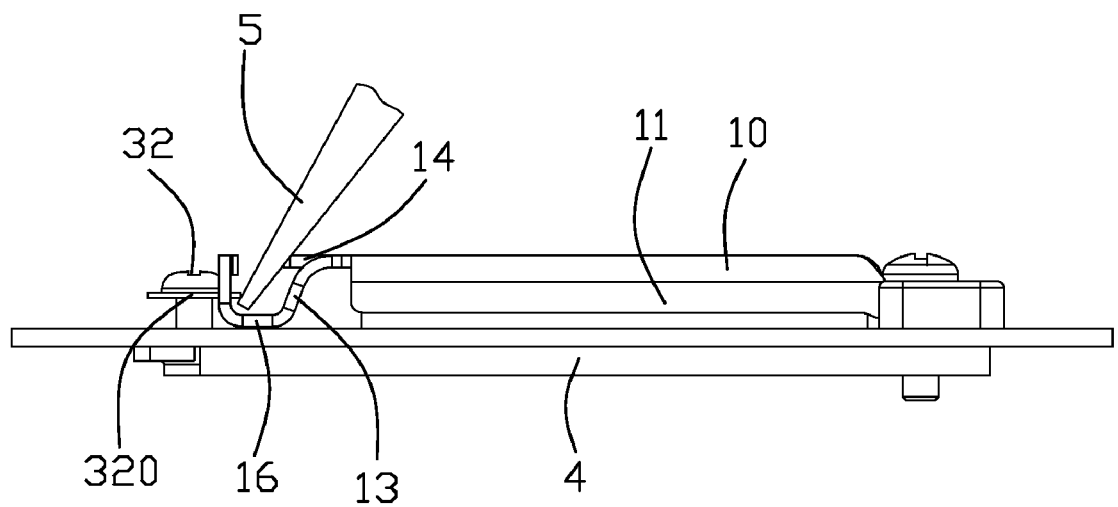
FIG. 4 shows the metallic cover locked with locking member.

Referring to FIGS. 3 to 4, the locking portion 13 of the metallic cover 10 could lock or release the locking member 32 easily, when we use a screwdriver 5. The screwdriver 5 inserts into the cutout 16 of the locking portion 13 to engage the locking member 32. The protruding tab 14 acts as a fulcrum to support the screwdriver 5. So that, the screwdriver 5 could deform the metallic cover 10 to release or lock with locking member 32, as the rotation posts 120 is flexible relative to the main portion 11. The washer 320 is pushed by the screwdriver 5 to allow the resilient portion 13 rotating to the closed position. Finally, the washer 320 partially inserts into the groove 150 and the hook portions 17 abut the against a lower surface of the washer 320.

The CPU socket 1 of the present invention removes a metallic lever. Therefore, the weight cost of the CPU socket 1 can be reduced. A common screwdriver or the similar tools can be used to driver the metallic cover 10 from the open position to the closed position or vice versa.

The CPU socket 1 and the PCB 2 may be reinforced by a bracket 4.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A CPU socket mounted on a printed circuit board (PCB), comprising:
   an insulative housing defining a receiving portion for receiving a CPU and a plurality of terminals disposed in the receiving portion;
   an installation section arranged with the insulative housing side by side;
   a metallic cover attached to the insulative housing, the metallic cover comprising a main portion, a locking portion and a resilient portion, the locking portion and the resilient portion extending oppositely from the main portion, the resilient portion rotatably assembled to the installation section, the locking portion having a pair of hook portions and a tool-receiving cutout adjacent to the pair of hook portions, and
   a locking member fixed to the PCB and arranged at one side of the insulative housing opposite to the installation section, said locking member having a planar locking piece extending parallel to the PCB;
   wherein when the metallic cover is at a closed position, where the terminals electrically connect the PCB and the CPU, the pair of hook portions abut against the locking piece to thereby lock the metallic cover on the locking member;
   said resilient portion extends from the lateral side walls, and has a pair of rotation posts projecting from distal ends of the lateral walls and extending along a direction perpendicular to the lateral side wall;
   the locking member is a bolt and the locking piece is a washer.

2. The CPU socket as claimed in claim 1, wherein the locking member is partially inserted into the groove.

3. The CPU socket as claimed in claim 1, wherein the installation section is integrally formed with the insulative housing.

4. The CPU socket as claimed in claim 1, wherein the locking portion of the metallic cover defines a groove above the pair of hook portions and communicating with the tool-receiving cutout.

5. The CPU socket as claimed in claim 4, wherein the locking piece of the locking member extends into the groove of the locking portion of the metallic cover when said metallic cover is at the closed position.

6. The CPU socket as claimed in claim 1, wherein the metallic cover defines a protruding tab extending towards the locking member and provides a space between the protruding tab and the pair of the hook portions.

7. The CPU socket as claimed in claim 6, wherein the protruding tab of the metallic cover forms a free distal end which is capable of providing a fulcrum when an external tool is used to lock the metallic cover to the locking member.

8. The CPU socket as claimed in claim 1, wherein the width of the installation section is larger than the width of the insulative housing and defines a pair of cavities thereon beside the insulative housing.

9. The CPU socket as claimed in claim 8, wherein the main portion of the metallic cover has a pair of lateral side walls extending away from the locking portion.

10. The CPU socket as claimed in claim 1, wherein; tip ends of the rotation posts face to each other and the rotation posts is flexible relative to the main portion.

11. The CPU socket as claimed in claim 10, wherein;
    a pair of fixing pins inserted into a pair of grooves of the insulative housing.

12. The CPU socket as claimed in claim 11, wherein the installation section defines a pair of slots at opposite sides thereof, and wherein the lateral side walls of the metallic cover are partially received in corresponding slots.

13. The CPU socket as claimed in claim 12, wherein the installation section defines a pair of cavities communicating with the slots, and wherein the rotation posts are rotatably assembled to the cavities.

14. The CPU socket as claimed in claim 13, wherein the metallic cover is capable of rotating around the rotating posts.

15. An electrical connector assembly comprising: a printed circuit board;
    an insulative housing mounted upon the printed circuit board, said housing defining a receiving cavity in an upper face, and opposite front and rear ends thereof in a front-to-back direction;
    a plurality of contacts disposed in the housing;
    a metallic cover seated upon the housing and defining a first end section retained around the front end, and a second end section, which is opposite to the first end section, retained around the rear end under condition that said cover is rotatable about the second end section once the first end section is released;
    a locking member mounted upon the printed circuit board around the front end for locking said first end section,
    said first end section defining a U-shaped structure in a vertical direction perpendicular to said front-to-back direction, with an upward trough like space into which a tool is allowed to downwardly enter and rotatably move for respective engagement with the locking member and the cover for pushing the cover away from the locking member, and an upward engaging face beside downwardly locked by said locking member; wherein
    a cutout is formed around the upward engaging face so as to allow said locking member to invade the trough like space as much as possible for enhancement of retention between the locking member and the upward engaging face;
    the cover member further comprising a resilient portion extends from lateral side walls, and a pair of rotation posts projecting from distal ends of the lateral walls and extending along a direction perpendicular to the lateral side wall;

the locking member is a bolt and the locking piece is a washer.

16. The electrical connector assembly as claimed in claim 15, wherein said cover further includes another upward engaging face spaced from and cooperating with said upward engaging face to be commonly located by two sides of said bolt, respectively.

17. The electrical connector assembly as claimed in claim 15, wherein said cover includes a protruding tab, around an upper portion of said trough like space, against which said tool abuts.

18. The electrical connector assembly as claimed in claim 15, wherein an edge of the first end section extends continuously along a transverse direction perpendicular to both said front-to-back direction and said vertical direction, with an offset section in compliance with an enlarged head of said locking member.

* * * * *